United States Patent [19]

Chao et al.

[11] Patent Number: 4,937,309

[45] Date of Patent: Jun. 26, 1990

[54] POLYMER USEFUL FOR MOLDING INTO A CIRCUIT BOARD SUBTRATE

[75] Inventors: Herbert S. Chao; James E. Harris, both of Piscataway; Stephen B. Rimsa, Lebanon, all of N.J.

[73] Assignee: Amoco Corporation, Chicago, Ill.

[21] Appl. No.: 393,609

[22] Filed: Aug. 14, 1989

Related U.S. Application Data

[63] Continuation of Ser. No. 115,300, Nov. 11, 1987, abandoned, which is a continuation of Ser. No. 11,898, Feb. 6, 1987, abandoned, which is a continuation of Ser. No. 932,136, Nov. 18, 1986, abandoned, which is a continuation of Ser. No. 756,576, Jul. 19, 1985, abandoned, which is a continuation of Ser. No. 566,298, Dec. 28, 1983, abandoned.

[51] Int. Cl.$^5$ .............................................. C08G 14/00
[52] U.S. Cl. ....................... 528/125; 528/171; 528/174; 528/219; 525/150; 525/390; 525/420; 525/434; 525/436; 525/437; 525/537; 524/609; 524/611
[58] Field of Search ............... 528/125, 171, 174, 219; 525/150, 390, 420, 434, 436, 437, 537; 524/609, 611

[56] References Cited

U.S. PATENT DOCUMENTS 4,503,168  3/1985  Hartsing, Jr. ................... 523/100
4,743,645  5/1988  Harris et al. ................... 524/456

Primary Examiner—John Kight, III
Assistant Examiner—Samuel A. Acquah
Attorney, Agent, or Firm—William H. Magidson; Ralph C. Medhurst

[57] ABSTRACT

Described are select polyarylethersulfones polymers which are useful for molding into a circuit board substrte. When metal is electroplated onto such a substrate, there is a high degree of adhesion of the metal to the circuit board.

2 Claims, No Drawings

POLYMER USEFUL FOR MOLDING INTO A CIRCUIT BOARD SUBTRATE

This application is a continuation of U.S. Ser. No. 011,898 filed Feb. 6, 1987, which is a continuation of U.S. Ser. No. 932,136 filed Nov. 18, 1986, which is a continuation of U.S. Ser. No. 756,576 filed July 19, 1985, which is a continuation of U.S. Ser. No. 566,298 filed Dec. 28, 1983, which is a continuation-in-part of Harris and Robeson Ser. No. 391,422 filed June 23, 1982 which is a continuation of application Ser. No. 115,300, filed Nov. 11, 1987.

BACKGROUND OF THE INVENTION

This invention is directed to a polymer useful for molding into a circuit board substrate, said polymer comprising a select polyarylethersulfone. Also, this invention is directed to a circuit board molded from said polyarylethersulfone.

Polyarylethersulfones containing the following repeat units:

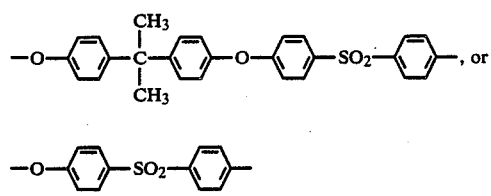

are commercially available polymers which have a wide variety of end-use applications. These polymers are described in, for example, U.S. Pat. Nos. 4,175,175 (polymer I) and 4,008,203 (polymer II). Such end-use applications include the use of these polymers for molding into circuit board substrates. However, a circuit board substrate molded from polyarylethersulfone (I) has a heat distortion temperature which is generally too low for soldering temperatures such as those encountered in wave soldering. Circuit boards molded from polyarylethersulfone (II) have an acceptable heat distortion temperature but do not have, in some instances, acceptable platability. Acceptable platability requires good adhesion of electrolessly plated copper to the circuit board substrate.

U.S. patent application Ser. No. 391,422, filed June 23, 1982, filed in the names of J. E. Harris et al and titled "A Composition Useful for Making Circuit Board Substrates and Electrical Connectors", commonly assigned describes a blend of 40 to 90 weight percent of a poly (ether sulfone), i.e., such as that of formula (II), and 10 to 60 weight percent of a polysulfone, such as that of formula (I). The application also states that the polyarylethersulfones described herein may be used. A circuit board substrate molded from the resultant composition is stated to have improved plateability.

The polyarylethersulfones of this invention are more particularly described in U.S. patent application Ser. No. 451,192 filed in the name of L. M. Maresca and titled "Aromatic Amorphous Thermoplastic Polymers", on Dec. 20, 1982, commonly assigned.

In the present invention it has been found that the incorporation of specified amounts of the following type of monomer:

in the synthesis of polyarylethersulfone (I), produces a polymer which is suitable for being molded into circuit board substrates. When metal is electroplated onto such circuit board substrates there is a high degree of adhesion of the metal to the circuit board substrate.

DESCRIPTION OF THE INVENTION

This invention is directed to a polymer useful for molding into a circuit board substrate, which polymer comprises a select polyarylethersulfone. This invention is also directed to a circuit board substrate molded from such a polyarylethersulfone.

The polyarylethersulfone of this invention is an amorphous thermoplastic polymer containing units of the formula:

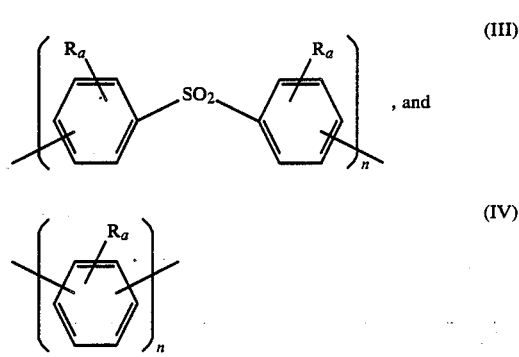

wherein R is independently hydrogen, $C_1$ to $C_6$ alkyl or $C_4$ to $C_8$ cycloalkyl, a is an integer of 0 to 4 and n is independently an integer of 1 to 3 and wherein the ratio of unit (III) to unit (IV) is greater than 1. The units are attached to each other by an —O— bond. The polyarylethersulfone contains from about 10 to about 75, and preferably from about 20 to about 65 mole percent of unit (IV), said mole percent based on the total dihydroxy starting material. The polymer may additionally contain the following unit:

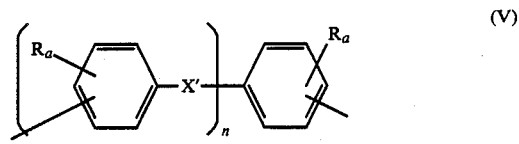

wherein R is as defind above, X' is independently

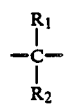

wherein $R_1$ and $R_2$ are independently hydrogen of $C_1$ to $C_9$ alkyl;

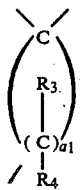

wherein $R_3$ and
$R_4$ are independently hydrogen or $C_1$ to $C_8$ alkyl; and $a_1$ is an integer of 2 to 7; —S—, —O—, or

a and n are as defined above.

A preferred polymer of this invention contains units of the formula:

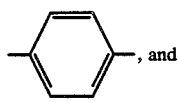, and

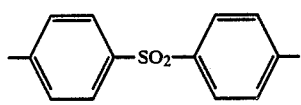

These units are attached to each other by and —O— bond. The polyarylethersulfone may be random or may have an ordered structure.

The polyarylethersulfones of this invention have a reduced viscosity of from about 0.4 to greater than about 2.5, as measured in N-methylpyrrolidone, or other suitable solvent, at 25° C.

The polyarylethersulfones of this invention are prepared by reacting the monomers represented by the following formulae:

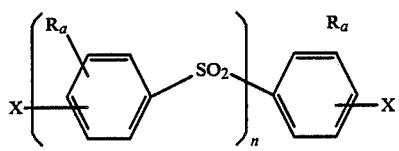 (VI)

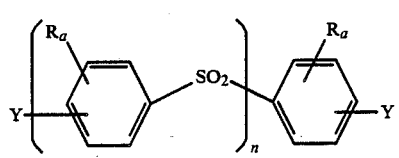 (VII)

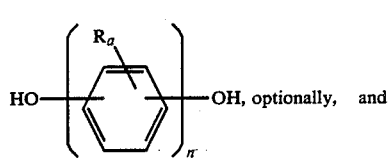 OH, optionally, and (VIII)

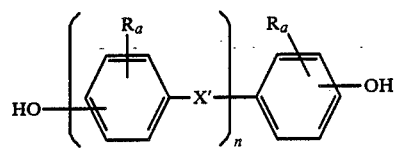 (IX)

wherein R, a, X' and n are as previously defined, and X and Y are independently selected from Cl, Br, F, $NO_2$ or OH and at least 50 percent of the Y's are OH.

The ratio of the concentration of OH groups to Cl, Br, F and/or $NO_2$ groups used to form the polyarylethersulfone is from about 0.90 to about 1.10, preferably from about 0.98 to about 1.02.

The monomers, represented by formulas (VI), (VII), (VIII), and (IX) include the following:
4,4'-dihydroxydiphenyl sulfone,
2,4'-dihydroxydiphenyl sulfone,
4,4'-dichlorodiphenyl sulfone,
4,4'-dinitrodiphenyl sulfone,
4-chloro-4'-hydroxydiphenyl sulfone,
2,2-bis(4-hydroxyphey1) propane, 4,4'-biphenol, hydroquinone, resorcinol, and the like.

The preferred monomers include hydroquinone, 4,4'-biphenol, 4,4'-dichlorodiphenyl sulfone, and 4,4'-dihydroxydiphenyl sulfone, or 4-chloro-4'-hydroxydiphenyl sulfone.

The polymers of this invention are prepared by contacting substantially equimolar amounts of the hydroxy containing compounds (depicted in formulas (VI) to (IX) supra) and halo and/or nitro containing compounds (depicted in formula (VI) and (VII) supra) with from about 0.5 to about 1.0 mole of an alkali metal carbonate per mole of hydroxyl group in a solvent mixture comprising a solvent which forms an azeotrope with water in order to maintain the reaction medium at substantially anhydrous conditions during the polymerization.

The temperature of the reaction mixture is kept at from about 120° to about 180° C., for about 1 to about 5 hours and then raised and kept at from about 200° to about 250° C., preferably from about 210° to about 230° C., for about 1 to 10 hours.

The reaction is carried out in an inert atmosphere, e.g., nitrogen, at atmospheric pressure, although higher or lower pressures may also be used.

The polyarylethersulfone is then recovered by conventional techniques such as coagulation, solvent evaporation, and the like.

The solvent mixture comprises a solvent which forms an azetrope with water and a polar aprotic solvent. The solvent which forms an azeotrope with water includes an aromatic hydrocarbon such as benzene, toluene, xylene, ethylbenzene, chlorobenzene, and the like.

The polar aprotic solvents employed in this invention are those generally known in the art for the manufacture of polyarylether sulfones and include sulfur containing solvents such as those of the formula:

$$R_5—S(O)_b R_5$$

in which each $R_5$ represents a monovalent lower hydrocarbon group free of aliphatic unsaturation, which preferably contains less than about 8 carbon atoms or when connected together represents a divaalent alkylene group with b being an integer from 1 to 2 inclusive.

Thus, in all of these solvents all oxygens and two carbon atoms are bonded to the sulfur atom. Contemplated for use in this invention are such solvents as those having the formula:

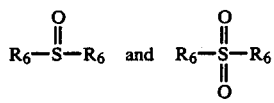

where the $R_6$ groups are independently lower alkyl, such as methyl, ethyl, propyl, butyl, and like groups, and aryl groups such as phenyl and alkylphenyl groups such as the tolyl group, as well as those where the $R_6$ groups are interconnected as in a divalent alkylene bridge such as:

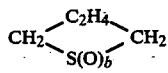

in tetrahydrothiophene oxides and dioxides. Specifically, these solvents include dimethylsulfoxide, dimethylsulfone, diphenylsulfone, diethylsulfoxide, diethylsulfone, diisopropylsulfone, tetrahydrothiophene 1,1-dioxide (commonly called tetramethylene sulfone or sulfolane) and tetrahydrothiophene-1 monoxide.

Additionally, nitrogen containing solvents may be used. These include dimethylacetamide, dimethylformamide and N-methylpyrrolidone.

The azetrope forming solvent and polar aprotic solvent are used in a weight ratio of from about 1:10 to about 1:1, preferably from about 1:5 to about 1:3.

In the reaction, the hydroxy containing compound is slowly converted, in situ, to the alkali salt thereof by reacting with the alkali metal carbonate. The alkali metal carbonate is preferably potassium carbonate. Mixtures of carbonates such as potassium and sodium carbonate may also be used.

Water is continuously removed from the reaction mass as an azeotrope with the azeotrope forming solvent so that substantially anhydrous conditions are maintained during the polymerization.

It is essential that the reaction medium be maintained substantially anhydrous during the polycondensation. While amounts of water up to about one percent can be tolerated, and are somewhat beneficial when employed with fluorinated dihalobenzenoid compounds, amounts of water substantially greater than this are desirably avoided as the reaction of water with the halo and/or nitro compound leads to formation of phenolic species and only low molecular weight products are secured. Consequently, in order to secure the high polymers, the system should be substantially anhydrous, and preferably contain less than 0.5 percent by weight water during the reaction.

Preferably, after the desired molecular weight has been attained, the polymer is treated with an activated aromatic halide or an aliphatic halide such as methyl chloride or benzyl chloride, and the like. Such treatment of the polymer converts the terminal hydroxyl groups into ether groups which stabilize the polymer. The polymer so treated has good melt and oxidative stability.

The polyarylethersulfone polymer may be used with other ingredients such as stabilizers, i.e., metal oxides such as zinc oxide, antioxidants, flame retardants, pigments, and the like. The polymer may be used with reinforcing fibers and/or inorganic fillers. The reinforcing fiber includes fiberglass, carbon fibers, and the like, and mixtures thereof. The particulate inorganic fillers which may be used include wollastonite, calcium carbonate, glass beads, talc, mica and the like, or mixtures thereof.

The fiber reinforcement, filler or combinations thereof, is utilized in amounts of from 0 to about 50 weight percent, preferably from about 10 to about 35 weight percent.

The polyarylethersulfone polymer in combination with the other ingredient is prepared by any conventional mixing methods. For example, polyarylethersulfone and other optional ingredients in powder or granular form are blended in an extruder and the mixture extruded into strands and the strands are chopped into pellets. The pellets are molded into the desired circuit board substrate by conventional techniques.

EXAMPLES

The following examples serve to give specific illustrations of the practice of this invention but they are not intended in any way to limit the scope of this invention.

Control A

A polymer having the following repeat unit was used:

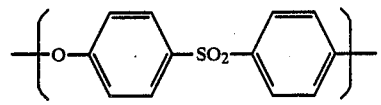

The polymer has a reduced viscosity of 0.5 dl/g as measured in N-methylpyrrolidone at 25° C.

EXAMPLE 1

A four neck 1000 ml round-bottom flask was equipped with a mechanical stirrer, thermometer, addition funnel, dry nitrogen inlet, and vacuum jacketed vigreux column with a distillate collector and condenser. Into the flask were charged 143.58 g (0.50 moles) of 4,4'-dichlorodiphenyl sulfone, 112.62 g (0.45 moles) of 4,4'-dihydroxydiphenyl sulfone, 5.51 g (0.05 moles) of hydroquinone, 76.02 g (0.55 moles) of potassium carbonate, 150 g of monochlorobenzene and 460 g of sulfolane. The mixture was purged with nirogen for 1 hour at room temperature and then heated to reflux (150° C.). After 1 hour at reflux, the temperature of the reaction was increased to about 235° C. by slowly removing the monochlorobenzene. After about 5 hours at 235° C., the reaction was diluted with monochlorobenzene and terminated by adding methyl chloride. The polymer so produced was recovered by coagulation in methanol followed by washing the polymer several times with hot water (80° C.). A theoretical yield of the polymer was obtained. The polymer had a reduced viscosity of 0.61 dl/g as measured in N-methylpyrrolidone (0.2 L g/100 ml) at 25° C. The polymer was made up of the following repeating unit:

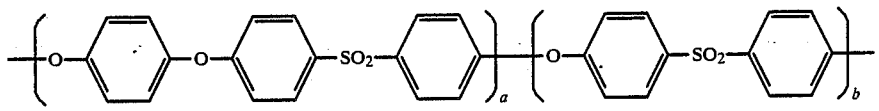

EXAMPLE 2

The procedure of Example 1 was exactly repeated except that 0.375 moles of 4,4'-dihydroxydiphenyl sulfone and 0.125 moles of hydroquinone were used.

EXAMPLE 3

The procedure of Example 1 as exactly repeated except that 0.25 moles of 4,4'-dihyroxydiphenyl sulfone and 0.25 moles of hydroquinone were used.

EXAMPLE 4

The procedure of Example 1 was exactly repeated except that 0.125 moles of 4,4'-dihydroxydiphenyl sulfone and 0.375 moles of hydroquinone were used.

Control B

The procedure of Example 1 was exactly repeated except that 0.50 moles of 4,4'-dichlorodiphenyl sulfone and 0.50 moles of hydroquinone were used.

Preparation of Substrates

Substrates were molded from the Examples and Controls in a 4×4×0.125 inch cavity mold. The mold was placed between the heated platins of a South Bend hydraulic press at 300° C. After forming under pressure to produce a plaque, the mold was cooled slowly over a period of about five minutes to room temperature. The substrates were immersed in an aqueous solution containing 30% concentration by volume of 1,3-dichloro-2-propanol for 90 seconds at 100;20 F. This constituted the pre-etch. The substrates were then rinsed (5 min @ 30°0 C.) and immersed in an etch which was a chromic acid solution of the following composition:

| | |
|---|---|
| 96% $H_2SO_4$ | 55.9 weight % |
| 87% $H_3PO_4$ | 10.4 weight % |
| $CrO_3$ | 3.0 weight % |
| $H_2O$ | 30.7 weight % |

Etching was accomplished in 10 minutes at 158° F. Following treatment, the surface of the substrate was made catalytic to a conventional electroless copper solution by immersion in a solution containing stannous chloride and palladium chloride. The substrate was then immersed in the autocatalytic electroless copper solution containing a chelating agent for cupric ion, a pH regulator and a reducing agent for cupric ion. After a thin copper coat appeared on the substrate, the substrate was electroplated to a thickness of about 2 mils. Following electroplating, the specimens were allowed to equilabrate for 72 hours in a vacuum oven at 120° F. Electroplate adhesion was then evaluated by the peel strength test.

The peel strength was determined by pulling a one-inch wide strip of metal from the substrate at a rate of 0.2"/min and an angle of 90° using an Instron Universal Testing Machine. The results are shown in the Table.

TABLE

| Example | Amount of Hydroquinone in Polymer (mole %) | Peel Strength (lbs/inch) |
|---|---|---|
| Control A | 0 | 2.4–3.1 |
| 1 | 10 | 3.8 |
| 2 | 25 | 4.4–14 |
| 3 | 50 | 10.5 |
| 4 | 75 | 7.5 |
| Control B | 100 | * |

*The substrate did not plate.

What is claimed is:

1. A circuit board substrate comprising a polyarylethersulfone polymer, which polymer contains units of the following formula:

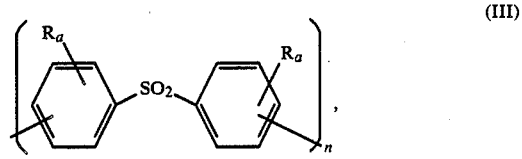

and

wherein R is independently hydrogen, $C_1$ to $C_6$ alkyl or $C_4$ to $C_8$ cycloalkyl, a is an integer of 0 to 4 and n is independently an integer of 1 to 3 and wherein the ratio of unit (III) to unit (IV) is greater than 1; said units (III) and (IV) being attached to each other by an —O— bond, and wherein unit (IV) is present in the polymer in amounts of from about 10 to about 75 mole percent, said mole percent based on the total dihydroxy starting material.

2. A circuit board substrate comprising a polyarylether sulfone polymer which polymer contains units of the formula:

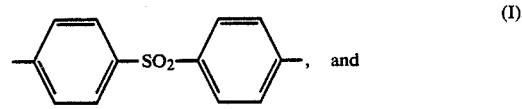

and

said units being attached to each other by an —O— bond, and wherein the ratio of Unit (I) to (II) is greater than (I).

* * * * *